US012610455B2

(12) United States Patent
Kim et al.

(10) Patent No.: US 12,610,455 B2
(45) Date of Patent: Apr. 21, 2026

(54) SHOCK ABSORBER ASSEMBLY FOR A PRINTED CIRCUIT BOARD

(71) Applicant: Sandisk Technologies, Inc., Milpitas, CA (US)

(72) Inventors: MyungJin Kim, Santa Clara, CA (US); Fu Xing Chan, Penang (MY); Chun Sean Lau, Penang (MY); Lihwa Fong, Irvine, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 407 days.

(21) Appl. No.: 18/357,759

(22) Filed: Jul. 24, 2023

(65) Prior Publication Data

US 2024/0381524 A1 Nov. 14, 2024

Related U.S. Application Data

(60) Provisional application No. 63/501,303, filed on May 10, 2023.

(51) Int. Cl.
H05K 1/02 (2006.01)
H05K 1/181 (2026.01)

(52) U.S. Cl.
CPC .......... H05K 1/0271 (2013.01); H05K 1/181 (2013.01); H05K 2201/2045 (2013.01); H05K 2201/209 (2013.01)

(58) Field of Classification Search
CPC ................. H05K 1/0271; H05K 1/181; H05K 2201/2045; H05K 2201/209; H05K 1/142; H05K 2201/10424; H05K 2201/10446; H05K 2201/10545
USPC ......................................................... 174/255
See application file for complete search history.

(56) References Cited

U.S. PATENT DOCUMENTS

| | | | | |
|---|---|---|---|---|
| 2013/0334388 A1* | 12/2013 | Li | ............................... | G06F 1/20 |
| | | | | 403/330 |
| 2024/0072469 A1* | 2/2024 | Murakami | ............. | H05K 7/142 |

* cited by examiner

*Primary Examiner* — Stanley Tso
*Assistant Examiner* — Sidi M Maiga
(74) *Attorney, Agent, or Firm* — DENTONS Durham Jones Pinegar

(57) ABSTRACT

A shock absorber for a printed circuit board (PCB) includes a first portion and a second portion. The first portion is positioned on a first side of the PCB at or near a connector that extends from the PCB. The second portion is positioned on a second side of the PCB, opposite the first portion. The first and second portions prevent the PCB from moving when the PCB is coupled to a host device. As the PCB is subjected to various movements, strains and stresses, the shock absorber prevents the PCB from cracking or breaking, especially at or near the connector, which is susceptible to cracking and breaking.

20 Claims, 9 Drawing Sheets

SHOCK ABSORBER ASSEMBLY FOR A PRINTED CIRCUIT BOARD

CROSS-REFERENCE TO RELATED APPLICATIONS

The present application claims priority to U.S. Provisional Application 63/501,303 entitled "SHOCK ABSORBER ASSEMBLY FOR A PRINTED CIRCUIT BOARD", filed May 10, 2023, the entire disclosure of which is hereby incorporated by reference in its entirety.

BACKGROUND

A printed circuit board may be subjected to a number of different stresses and strains over its lifetime. For example, the printed circuit board may be housed within an electronic device. Movement or motion of the electronic device (especially sudden and/or abrupt motion, such as a drop event) may cause the printed circuit board to move, vibrate and/or deflect. Movement, vibrations and deflections may cause various components of the printed circuit board to crack or break. For example, solder balls of a controller of the printed circuit board may be especially vulnerable to cracking or breaking when the printed circuit board is subjected to these stresses and strains, as well as strain caused by shock and/or vibration stresses near a mating connector.

Accordingly, it would be beneficial for a printed circuit board to have a mechanism or assembly that reduces the various strains and stresses on a printed circuit board when the printed circuit board is coupled to a host device or otherwise housed within an electronic device.

SUMMARY

A printed circuit board is typically connected to a host device (e.g., a motherboard) using a connector. In an example, the connector may be an edge connector that extends from, or is otherwise formed out of, an edge or side of the printed circuit board. The connector may mate with a matching connection mechanism (e.g., a socket) on the host device.

When connected to the host device, the printed circuit board may be subjected to a number of different strains or stresses. These strains or stresses may cause the printed circuit board to deflect or bend. For example, if the host device is dropped, the impact may cause the printed circuit board to move or bend-especially at or near the connector. Movement or bending of the printed circuit board may cause major components on the printed circuit board and/or connection mechanisms (e.g., solder balls, vias) on the printed circuit board to break or crack.

In order to address the above, the present application describes a shock absorber (also referred to as a shock absorber device and/or a shock absorber assembly) that reduces or eliminates an amount of strain or stress that may be applied on the printed circuit board. In an example, the shock absorber is mounted to the printed circuit board at or near a connector of the printed circuit board. For example, a first portion of the shock absorber may be mounted to a top surface of the printed circuit board and a second portion of the shock absorber may be mounted to a bottom surface of the printed circuit board, opposite the first portion of the shock absorber.

One or more features of each of the first portion of the shock absorber and the second portion of the shock absorber are adapted or otherwise configured to receive at least a portion of an assembly or an enclosure or housings that contains or is otherwise associated with the printed circuit board. The shock absorber helps restrict or prevent Z direction movement (e.g., up and down movement) and/or Y direction movement (e.g., side to side movement) when the printed circuit board is subjected to various stresses and strains-especially those that are caused by sudden/abrupt movements, vibrations, or the normal strains and stresses caused by normal/expected use.

Accordingly, the present application describes a shock absorber device for a printed circuit board. In an example, the shock absorber device includes a base having a top surface and a bottom surface opposite the top surface. A sidewall extends from at least a portion of the top surface of the base. The sidewall is perpendicular to the base and defines an outer surface and an inner surface opposite the outer surface. The shock absorber device also includes a flange that extends from, and is perpendicular to, a first portion of the inner surface of the sidewall. The flange includes a top surface and a bottom surface and a protrusion extends from the bottom surface of the flange. The shock absorber also includes a shelf. The shelf is perpendicular to, and extends from, a second portion of the inner surface of the sidewall. In an example, the shelf is adapted to support at least a portion of an enclosure associated with the printed circuit board.

The present application also describes a shock absorber assembly for a printed circuit board. In an example, the shock absorber assembly includes a first shock absorber and a second shock absorber. The first shock absorber may be coupled to a first side of the printed circuit board and the second shock absorber may be coupled to a second side of the printed circuit board opposite from the first shock absorber. In an example, the first shock absorber includes a base having a top surface and a bottom surface opposite the top surface. A sidewall extends from at least a portion of the top surface of the base. The sidewall may be perpendicular to the base and may also define an outer surface and an inner surface opposite the outer surface. A flange extends from a first portion of the inner surface of the sidewall. The flange may be perpendicular to the sidewall. The first shock absorber may also include a shelf that is perpendicular to, and extends from, a second portion of the inner surface of the sidewall. In an example, the shelf supports at least a portion of an enclosure associated with the printed circuit board. The second shock absorber may be separate from the first shock absorber. In an example, the second shock absorber includes a substantially planar top surface, a substantially planar bottom surface opposite the substantially planar top surface, and a sidewall that extends between the substantially planar top surface and the substantially planar bottom surface.

Also described is a shock absorber for a printed circuit board. In this example, the shock absorber includes a base and a sidewall. The sidewall is perpendicular to, and extends from, the base. The sidewall also defines a first surface and a second surface. The shock absorber also includes an attachment means that is perpendicular to, and extends from, a top edge of the inner surface of the sidewall, a locking means that extends from a bottom surface of the attachment means, and a support means. The locking means may be adapted to receive at least a portion of an enclosure means associated with the printed circuit board. The support means is perpendicular to, and extends from, the inner surface of the sidewall. In an example, the support means extends from the inner surface of the sidewall beneath the top edge of the inner surface of the sidewall and is adapted to support at least a portion of the enclosure means associated with the printed circuit board.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

-FIG. 2B is coupled to the enclosure of FIG. 4A according to an example.

DETAILED DESCRIPTION

Figure 1A:
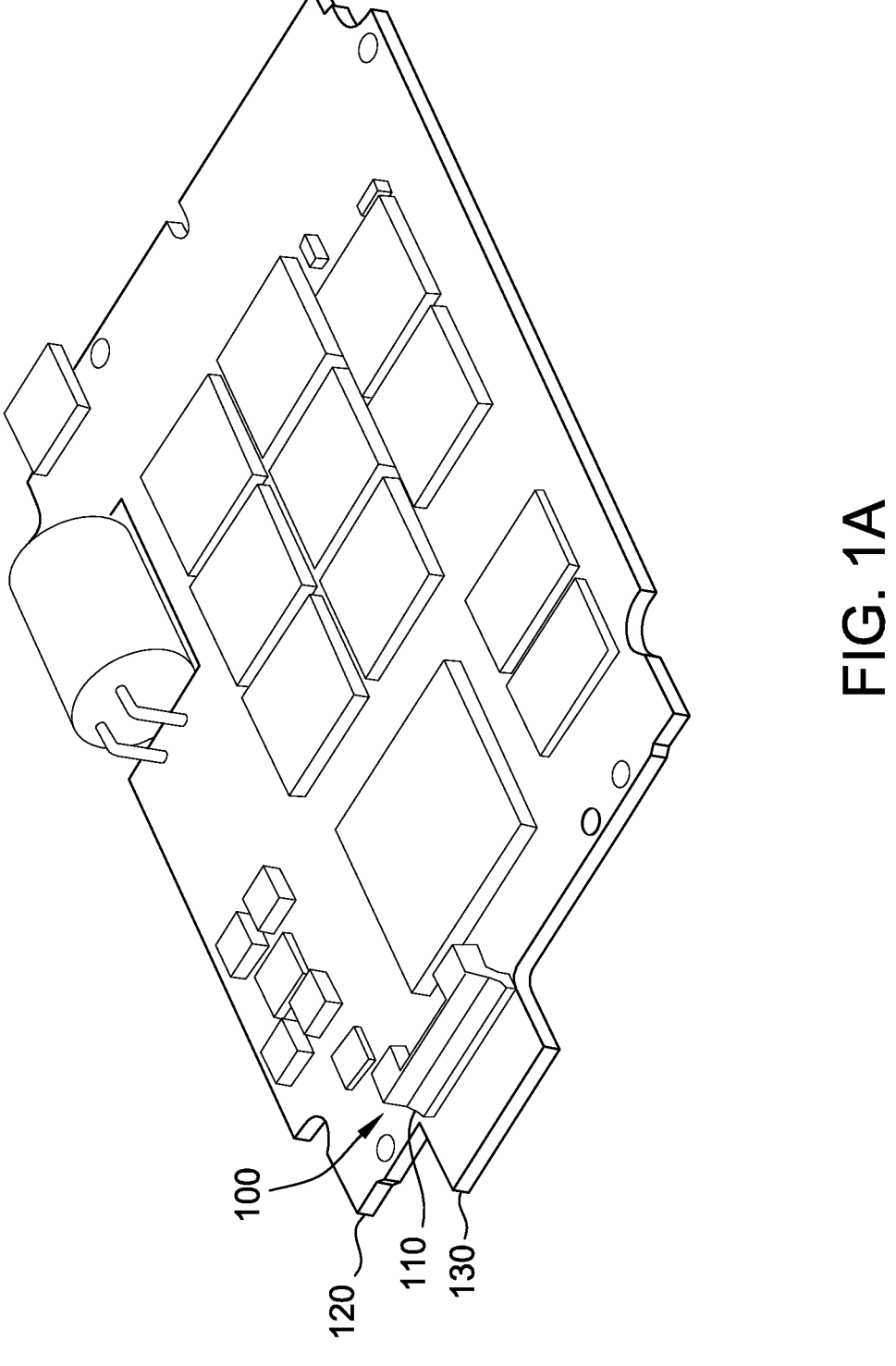
FIG. 1A is a top perspective view of a shock absorber provided on a printed circuit board according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

The present application describes a shock absorber (also referred to as a shock absorber device and/or a shock absorber assembly) for a printed circuit board (PCB). The shock absorber may include a first portion and a second portion that is separate from the first portion. In an example, the first portion may be placed on or otherwise coupled to a first side of the printed circuit board (e.g., near a connector of the printed circuit board) and the second portion may be placed on or otherwise coupled to a second side of the printed circuit board and opposite the first portion. The first portion and the second portion work in conjunction to help prevent movement and/or deflection of the printed circuit board when the printed circuit board and/or the various components electrically and/or communicatively coupled to the printed circuit board, are subjected to various strains and/or stresses.

For example, a printed circuit board is typically connected to a host device, such as a motherboard or other printed circuit board, using a connector. In the examples described herein, the connector is an edge connector that extends from, or is otherwise formed out of, an edge or side of the printed circuit board. Although an edge connector is shown and described, the shock absorber described herein may be used on any number of different printed circuit boards that utilize any number of different connectors.

When connected to the host device, the printed circuit board may be subjected to a number of different strains or stresses (e.g., movement, vibrations, thermal stress). These strains and stresses may cause the printed circuit board to deflect or bend. Any type of movement, deflection or bending of the printed circuit board may cause the connection mechanisms (e.g., solder balls, vias) that couple various components to the printed circuit board to break or crack. In another example, the edge connector may also be susceptible to breaking or cracking.

However, the shock absorber of the present disclosure reduces or eliminates the strains and stresses that are applied on the printed circuit board. As a result, any connection mechanisms that are used to couple the various components to the printed circuit board are less likely to crack and/or break. For example, one or more features of the first portion of the shock absorber and the second portion of the shock absorber are adapted or are otherwise configured to receive at least a portion of an assembly or an enclosure that contains, houses, or is otherwise associated with the printed circuit board. The shock absorber restricts movement of the printed circuit board in a Z direction and/or a Y direction.

In accordance with the above, many technical benefits may be realized including, but not limited to prolonging a lifespan of a printed circuit board by reducing or eliminating stress-induced cracking/breaking and increasing the reliability of the printed circuit board.

These benefits, along with other examples, will be shown and described in greater detail with respect to FIG. 1A-FIG. 6B.

FIG. 1A is a top perspective view of a shock absorber 100 provided on a printed circuit board 120 according to an example. In an example, the printed circuit board 120 is an Enterprise and Data Center SSD (EDSFF) printed circuit board, such as, for example, an E3 form factor eSSD. While an EDSFF printed circuit board is specifically mentioned, the shock absorber 100 may be used with any printed circuit board.

In the example shown, the printed circuit board 120 includes a connector 130. The connector 130 may be an edge connector that extends from a side of the printed circuit board 120. The connector 130 enables the printed circuit board 120 to be removably coupled to a host device.

However, the printed circuit board 120 may be subjected to a number of different strains or stresses which may cause portions of the printed circuit board 120 to crack or break. For example, the connector 130 of the printed circuit board 120 may be especially vulnerable to cracking or breaking when the printed circuit board 120 is subjected to various strains and/or stresses. These strains and/or stresses may occur due to repeated insertion and removal of a mating connector.

Figure 1B:
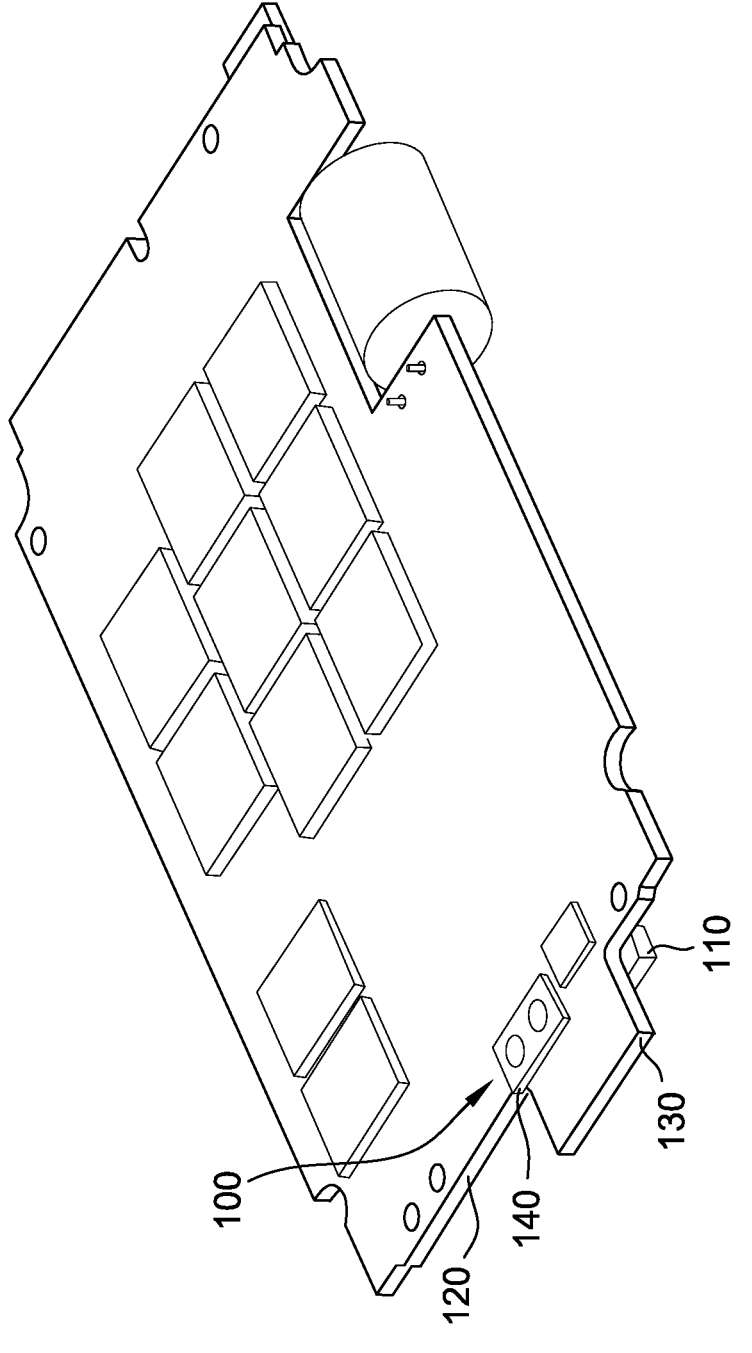
FIG. 1B is a bottom perspective view of the shock absorber of FIG. 1A provided on the printed circuit board according to an example.

In order to address the above, and in order to reduce or eliminate the risk that the printed circuit board 120 breaks or cracks, a shock absorber 100 is provided on the printed circuit board 120. In an example, the shock absorber 100 includes a first portion 110 and a second portion 140 (FIG. 1B). The first portion 110 of the shock absorber 100 may be positioned on a first side of the printed circuit board 120 at or near the connector 130. For example, the first portion 110 of the shock absorber 100 may be positioned at or near a location from which the connector 130 extends from the printed circuit board 120.

FIG. 1B is a bottom perspective view of the shock absorber 100 of FIG. 1A provided on the printed circuit board 110 according to an example. As shown in FIG. 1B, the shock absorber 100 may also include a second portion 140. The second portion 140 may be separate from the first portion 110. In an example, the second portion 140 is provided on a second side of the printed circuit board 140 opposite the first portion 110. For example, the second portion 140 may be provided on the second side of the printed circuit board 140 at or near a location from which the connector 130 extends from the printed circuit board 120.

Figures 2A, 2B:
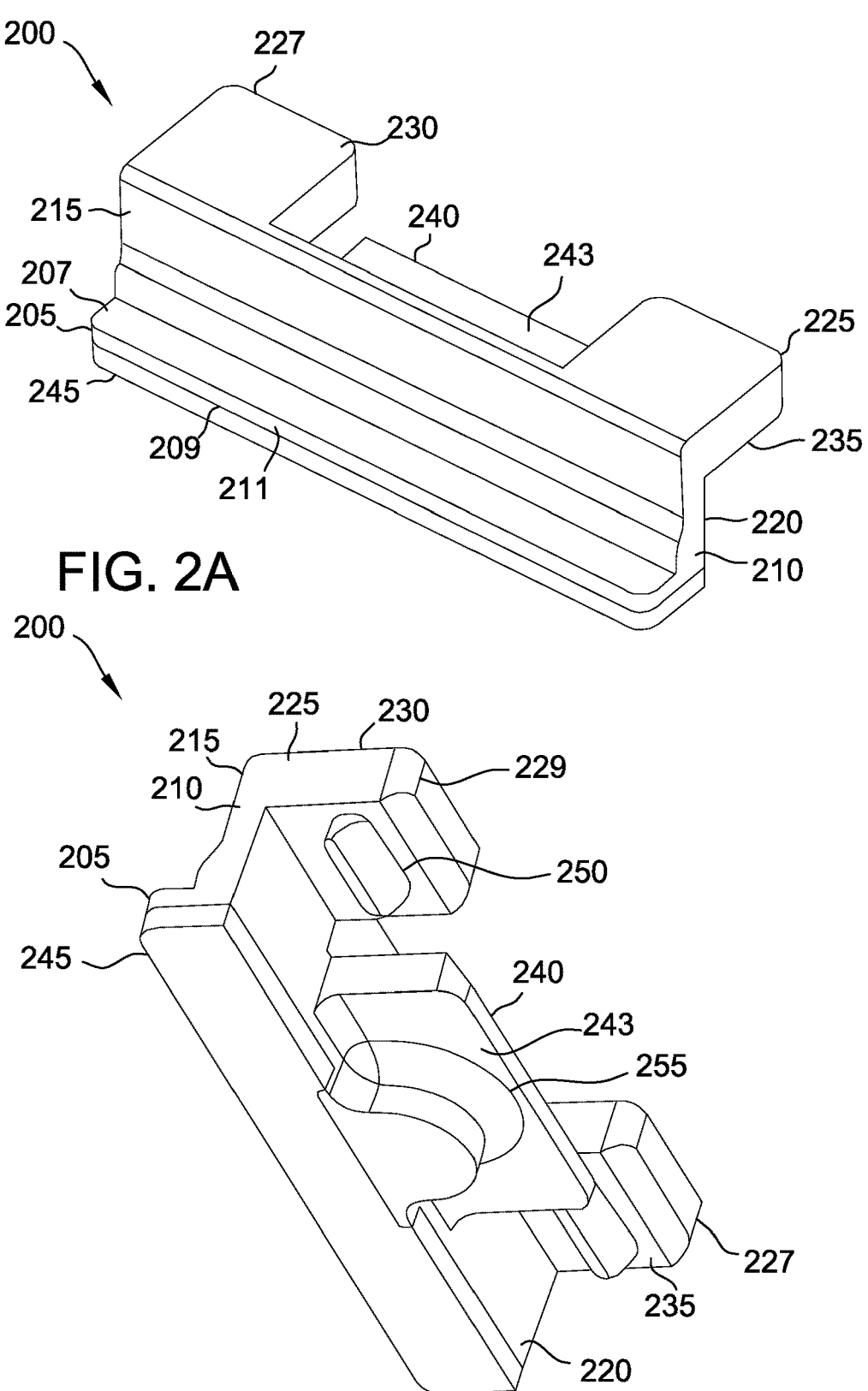
FIG. 2A is a top perspective view of a shock absorber for a printed circuit board according to an example.
FIG. 2B is bottom perspective view of the shock absorber of FIG. 1A according to an example.

FIG. 2A is a top perspective view of a shock absorber 200 for a printed circuit board according to an example. In an example, the shock absorber 200 may be similar to the first portion 110 of the shock absorber 100 shown and described with respect to FIG. 1A-FIG. 1B.

In an example, the shock absorber 200 is comprised of rubber, plastic and/or other materials or a combination thereof. Each of the different features of the shock absorber 200 described below may form a single, unitary piece. For example, the shock absorber 200 may be created using an injection molding process. In another example, one or more features of the shock absorber 200 may be coupled together during a manufacturing process.

In an example, the shock absorber 200 includes a base 205. The base 205 may have a substantially planar top surface 207 and a substantially planar bottom surface 209. A side 211 may extend between the bottom surface 209 and the top surface 207. The side 211 may have a thickness or dimension. The thickness of the side 211 and/or the base 205 may be approximately 0.50 mm. While specific dimensions are mentioned, the dimensions of the base 205 (and other components of the shock absorber 200) may change based on design requirements and/or otherwise be modified for specific printed circuit boards and various applications.

The shock absorber 200 also includes a sidewall 210. In an example, the sidewall 210 extends from the top surface 207 of the base 205 and is perpendicular to the base 205. A length of the sidewall 210 may be approximately 17 mm. In an example, a length of the sidewall 210 is substantially equivalent to a length of the base 205. For example, the sidewall 210 may extend from a proximal end of the base 205 to a distal end of the base 205. In another example the base 205 may have a first length and the sidewall 210 may have a different length.

The sidewall 210 includes an outer surface 215 and an inner surface 220 opposite the outer surface 215. The inner surface 220 (or at least a portion of the inner surface 220) may be planar or substantially planar 210. Likewise, the outer surface 215 may be planar or substantially planar. A distance between the outer surface 215 of the sidewall 210 and the inner surface 220 of the sidewall 210 define a width of the sidewall 210.

In an example, the width of the sidewall 210 is less than the width of the base 205. Thus, the sidewall 210 may extend from a portion of the base 205. In another example, the width of the sidewall 210 (or the width of one or more portions of the sidewall 210) may be substantially equivalent to the width of the base 205.

The width of the sidewall 210 may be uniform, or substantially uniform, from a bottom portion (e.g., a portion that extends from the base 205) to a top portion. In another example, the sidewall 210 may have a first width at or near the base 205 and a second (e.g., narrower) width near the top portion.

For example, the sidewall 210 may have a first width from the bottom portion to a middle portion and have the second width from the middle portion to the top portion. As will be explained in greater detail below, the increased width from the bottom portion to the middle portion of the sidewall 210 may provide extra support for a shelf 240 that extends from the inner surface 220 of the sidewall 210. A transition between the first width and the second width may be rounded, diagonal, squared or have any other type of transition.

The shock absorber 200 also includes a first flange 225 and a second flange 227. In an example, the first flange 225 and the second flange 227 are perpendicular, or substantially/near perpendicular to the sidewall 210. Additionally, the first flange 225 and the second flange 227 may extend from a top edge or top portion of the inner surface 220 of the sidewall 210. In an example, the first flange 225 and the second flange 227 extend from the top edge of the inner surface 220 of the sidewall by approximately 3.30 mm and have a width of approximately 4.2 mm.

Each of the first flange 225 and the second flange 227 have a top surface 230 and a bottom surface 235 opposite the top surface 230. A distance between the top surface 230 and the bottom surface 235 define a height or thickness of each flange. In an example, the first flange 225 and the second flange 227 have a height or thickness of approximately 1.5 mm.

In an example, the first flange 225 is located on a proximal end (or a first side) of the top edge of the sidewall 210 and the second flange 227 is located on a distal end (or a second side) of the top edge of the sidewall 210. The first flange 225 and the second flange 227 are separated by a space or otherwise define an aperture.

Although two flanges and shown and described, the shock absorber 200 may include fewer than two flanges or more than two flanges. Additionally, each flange may extend from, or otherwise be located at, any position on the inner surface 220 of the sidewall 210.

The shock absorber 200 may also include a shelf 240. In an example and as briefly discussed above, the shelf 240 may extend perpendicularly from the inner surface 220 of the sidewall 210. A length at which the shelf 240 extends from the inner surface 220 of the sidewall 210 may be similar or substantially similar to the length at which each of the first flange 225 and the second flange 227 extend from the inner surface 220 of the sidewall 210.

In an example, the shelf 240 extends from a middle portion of the inner surface 220 of the sidewall 210 (e.g., a portion or location at which the sidewall 210 transitions from the first width to the second width). Although a middle portion is specifically mentioned, the shelf 240 may extend from any portion of the inner surface 220 of the sidewall 210 that is lower than or otherwise beneath the bottom surface 235 of the first flange 225 and/or the second flange 227.

The shelf 240 may have width of approximately 8.7 mm. In an example, a width of the shelf 240 may be substantially equivalent to the space or aperture between the first flange 225 and the second flange 227.

The shelf 240 may have a planar or substantially planar top surface 243. As will be explained in greater detail below, the top surface 243 may support and/or secure at least a portion of an enclosure that is part of, or otherwise associated with, a printed circuit board on which the shock absorber is coupled. Additionally, the first flange 225 and the second flange 227 may also be used to support and/or secure at least a portion of the enclosure. As such, a distance between the top surface 243 of the shelf 240 and the bottom surface 235 of each of the first flange 225 and the second flange 227 may be equivalent or substantially equivalent to a width or thickness of the enclosure.

The shock absorber 200 may also include a stiffener 245. The stiffener 245 may be coupled to the bottom surface 209 of the base 205. In an example, the stiffener 245 has the same or similar dimensions as the base 205. In an example, the stiffener is comprised of a material that may provide additional structural support to a printed circuit board and/or the shock absorber 200. For example, the stiffener 245 may be comprised of a hard rubber (e.g., rubber material that is harder than the rest of the rubber material of the shock absorber 200) or a hard plastic.

FIG. 2B is bottom perspective view of the shock absorber 200 of FIG. 2A according to an example. The perspective view is used to show additional features of the shock absorber 200.

For example and as shown in FIG. 2B, each of the first flange 225 and the second flange 227 include a protrusion 250 extending from the bottom surface 235. In the example shown, the protrusions 235 have a tapered configuration. Although a tapered configuration is specifically mentioned and shown, the protrusions 250 may have any number of different shapes and/or dimensions.

As also shown in FIG. 2B, each of the first flange 225 and the second flange 227 may include a tapered edge 229. The tapered edge 229 may enable the enclosure to be more easily coupled to the shock absorber 200. Additionally, and as will be explained in greater detail below, each protrusion 250 may be configured to mate with one or more openings or apertures defined by the enclosure when the shock absorber 200 is coupled to the enclosure. Likewise, the shelf 240 may also be used to support at least a portion of the enclosure.

The shelf 240 may also include a support structure 255. The support structure 255 may extend from the bottom surface of the base portion 205 and/or the stiffener 245 to a bottom surface 243 of the shelf 240. The support structure 255 may cover a portion of the bottom surface 243 of the shelf 240, all of the bottom surface 243 of the shelf 240 or substantially all of the bottom surface 243 of the shelf 240.

Figure 3A:
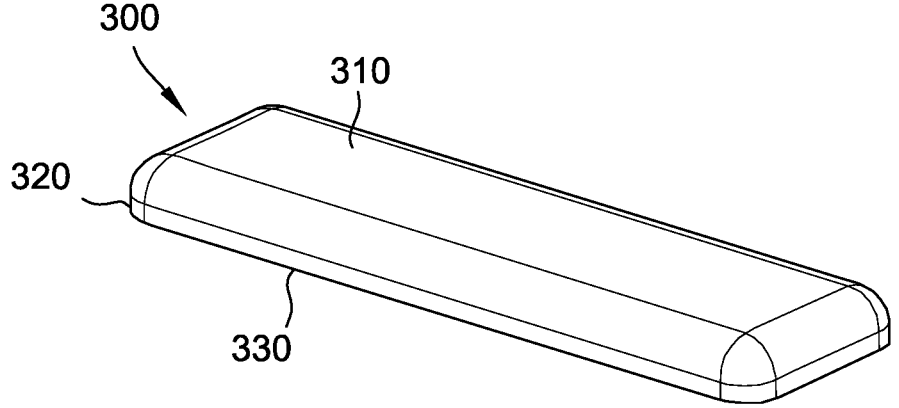
FIG. 3A is a top perspective view of another shock absorber for a printed circuit board according to an example.

FIG. 3A is a top perspective view of another shock absorber 300 for a printed circuit board according to an example. The shock absorber 300 may be similar to the second portion 140 of the shock absorber 100 shown and described with respect to FIG. 1A-FIG. 1B. The shock absorber 300 may be placed on a surface of a printed circuit board opposite from a surface of the printed circuit board on which the shock absorber 200 is placed.

In an example, the shock absorber 300 may include a substantially planar top surface 310 and a substantially planar bottom surface 330. A wall 320 may extend between the substantially planar top surface 310 and the substantially planar bottom surface 330. In an example, the dimensions of the shock absorber 300 may be 20.0 mm (width) by 6.0 mm (depth) by 1.25 mm (thick).

In the example shown, the shock absorber 300 has a rounded edge or transition between the top surface 310 and the wall 320. In an example the rounded edge may minimize an XY (e.g., width and/or depth) size expansion degree of the shock absorber 300 on a printed circuit board while the shock absorber 300 is flattened or compressed. As such, additional room may be provided on the printed circuit board to other hardware components. Additionally, the rounded edge may help gradually transfer compression stress on the shock absorber to the printed circuit board Although a rounded edge is shown, the edge between the wall 320 and the top surface may have any shape.

Figure 3B:
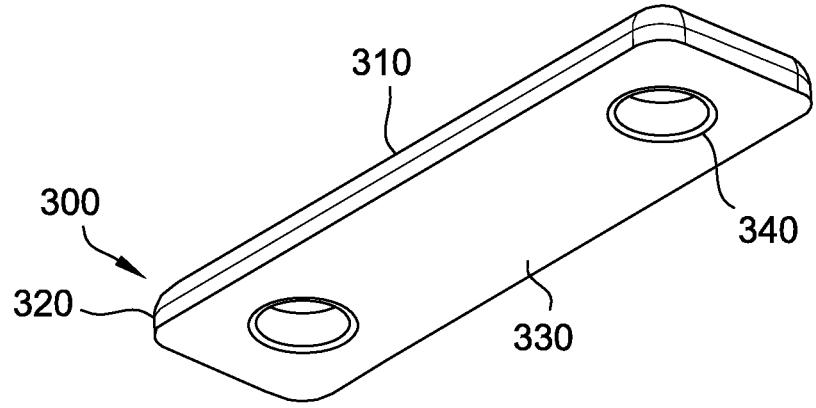
FIG. 3B is bottom perspective view of the shock absorber of FIG. 2A according to an example.

FIG. 3B is bottom perspective view of the shock absorber 300 of FIG. 3A according to an example. As shown in FIG. 3B, the bottom surface 330 of shock absorber 330 may define one or more apertures 340 or alignment holes. The apertures 340 or alignment holes may be used to secure the shock absorber 300 to an enclosure associated with a printed circuit board.

Figure 4A:
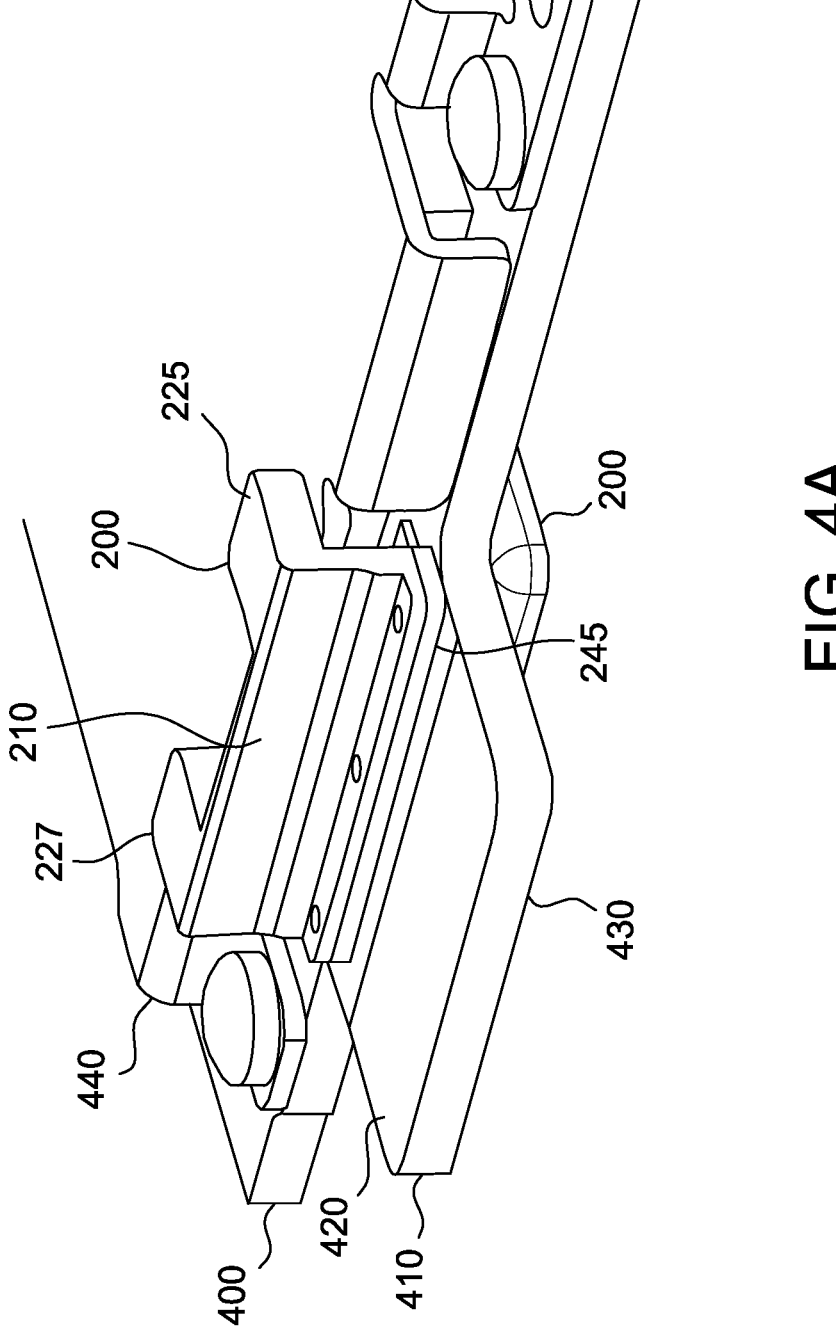
FIG. 4A is a top perspective view of the shock absorber of FIG. 1A-FIG. 3B being coupled to a printed circuit board and an associated enclosure according to an example.
Figure 4B:
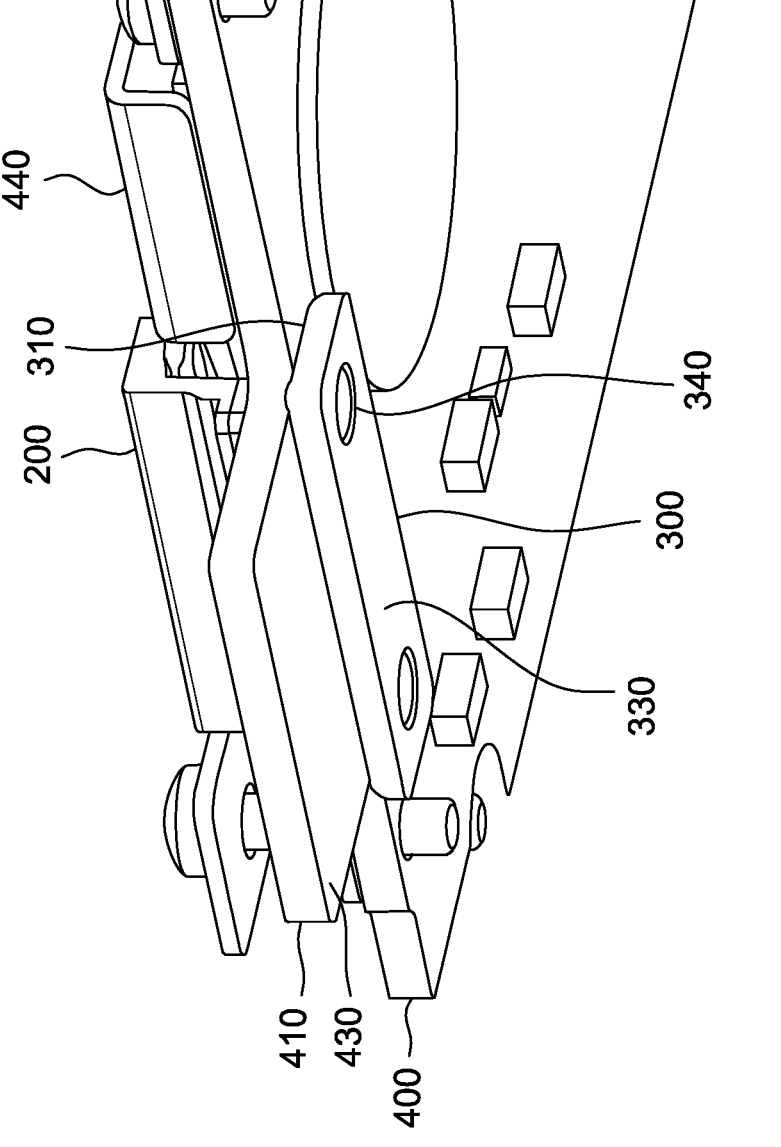
FIG. 4B is a bottom perspective view of the shock absorber of FIG. 1A-FIG. 3B being coupled to the printed circuit board and the associated enclosure according to an example.

FIG. 4A is a top perspective view of the shock absorber 200 of FIG. 2A-FIG. 2B and the shock absorber 300 of FIG. 3A-FIG. 3B being coupled to a printed circuit board 400 and an associated enclosure 440 according to an example and FIG. 4B is a bottom perspective view of the shock absorber of FIG. 2A-FIG. 2B and the shock absorber of FIG. 3A-FIG. 3B being coupled to the printed circuit board 400 and the associated enclosure 440 according to an example.

The printed circuit board 400 includes a first surface 420 (or top surface) and a second surface 430 (or bottom surface) opposite the first surface 420. In an example, a connector 410 extends from an edge of the printed circuit board 400. Although an edge connector is specifically shown and described, the printed circuit board 400 may have any type of connector.

The shock absorber 200 may be coupled to the first surface 420 of the printed circuit board 400. For example, the bottom surface of the stiffener 245 may be coupled to the first surface 420 of the printed circuit board. In an example, the shock absorber 200 is coupled to the first surface 420 of the printed circuit board 400 at or near the connector 410. For example, the shock absorber 200 may be located at or near a location from which the connector 410 extends from the printed circuit board 400. In an example, this location is where the printed circuit board 400 may be most susceptible to breaks or cracks.

Additionally, the top surface 310 of the shock absorber 300 may be coupled to or otherwise contact the second surface 430 of the printed circuit board 400. Like the shock absorber 200, the shock absorber 300 may be located at or near the connector 410. For example, the shock absorber 300 is located on the second surface 430 of the printed circuit board 400 opposite from the shock absorber 200.

In an example, the printed circuit board 400 is associated with an enclosure 440. In the example shown, the enclosure 440 is a heatsink or similar enclosure. Although a heatsink is specifically mentioned, the enclosure 440 may be any type of enclosure that at least partially surrounds or otherwise encloses the printed circuit board 400.

At least a portion of the enclosure 440 is received by the shock absorber 200. For example, a proximal end of the enclosure 440 may be received in a space defined by the shelf 240 (FIG. 2A), the first flange 225 and the second flange 227. The shelf 240, the first flange 225 and the second flange 227, and their respective protrusions 250 (FIG. 2B) may secure the enclosure 440 in place.

In an example, the shock absorber 200 may be coupled to or otherwise receive the enclosure 440 using snap-fit methodology. For example, the first flange 225, the second flange 227 and/or portions of the shock absorber 200 may be flexible or otherwise be moveable from a first position to a second position. The flexibility may enable the enclosure 440 to be easily coupled to the shock absorber 200.

For example, when the shock absorber 200 receives the proximal end of the enclosure 440, the proximal end of the enclosure 440 contacts the protrusions 250 (FIG. 2B) of the first flange 225 and the second flange 227. Contact between the proximal end of the enclosure 440 and the protrusions 250 cause the first flange 225 and the second flange 227 to move (e.g., slightly upward and/or away from the enclosure) which enables the proximal end of the enclosure 440 to be received (e.g., the proximal end of the enclosure 440 contacts the inner surface 220 (FIG. 2A) of the sidewall 200 (FIG. 2A)) by the shock absorber 200.

Once the proximal end of the enclosure 440 has been received by the shock absorber 200, the protrusions 250 of the first flange 225 and the second flange 227 are received into corresponding apertures defined by the enclosure 440. Additionally, the shelf 240 may also be used to support a bottom surface of the proximal end of the enclosure 440.

Figure 5:
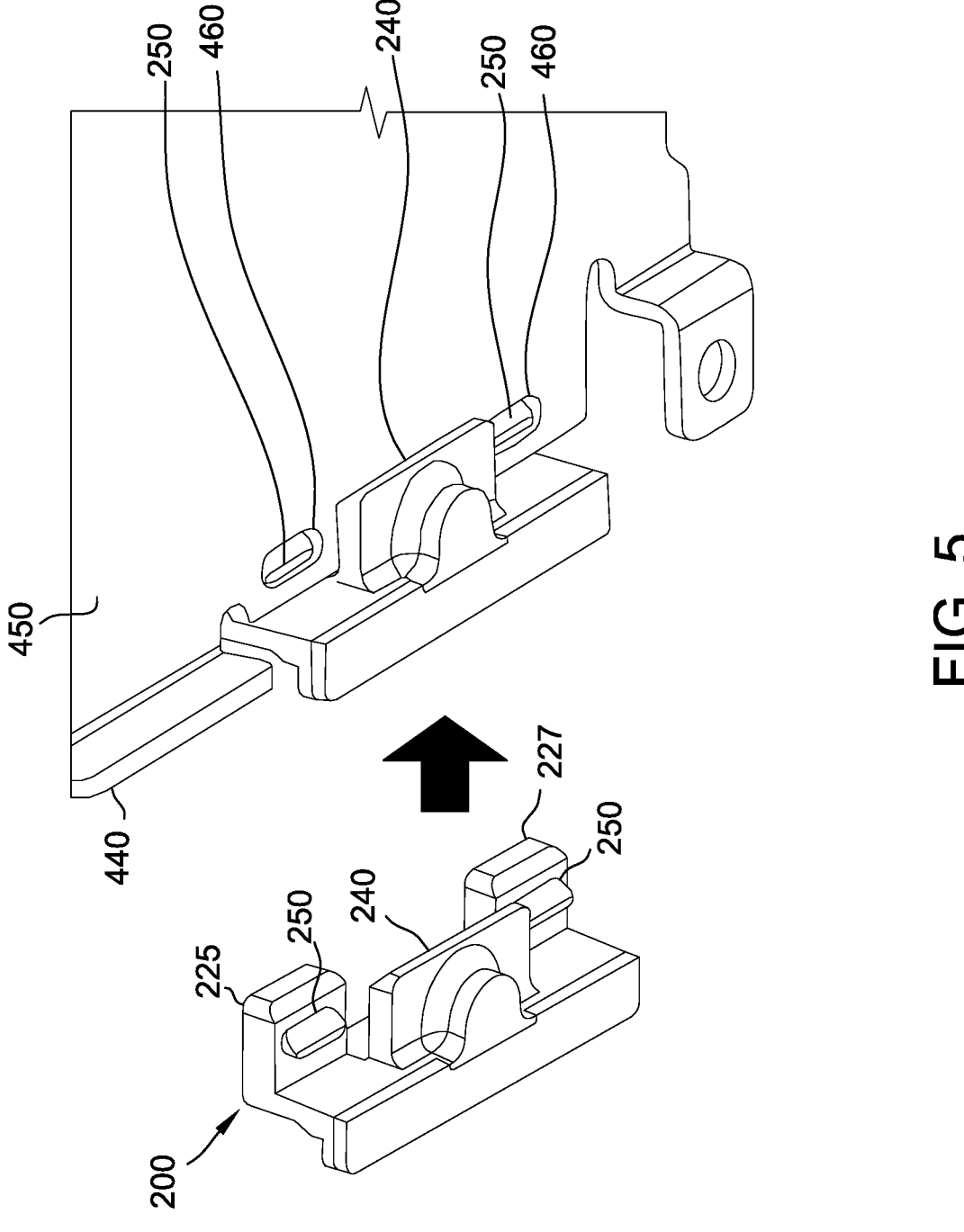
FIG. 5 illustrates how the shock absorber of FIG. 2A

FIG. 5 illustrates how the shock absorber 200 of FIG. 2A-FIG. 2B is coupled to the enclosure 440 of FIG. 4A according to an example.

As shown in FIG. 5, the enclosure 440 defines one or more apertures 460. When the enclosure 440 is received by the shock absorber 200, the protrusions 250 of the first flange 225 and the second flange 227 are received into corresponding apertures 460 defined by the enclosure 440. Additionally, a top surface of the shelf 240 contacts or otherwise supports a bottom surface 450 of the enclosure 440.

Figure 6A:
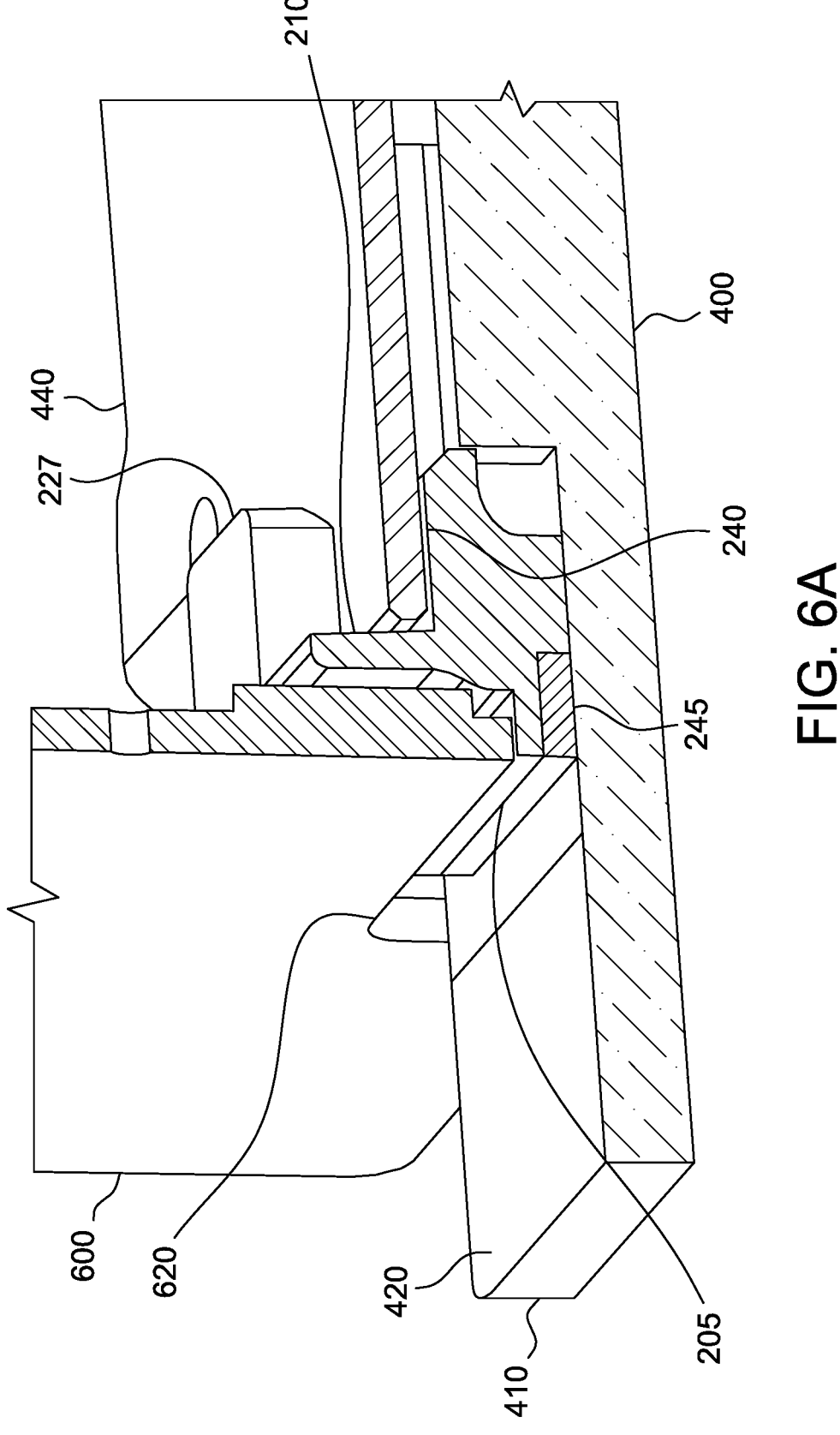
FIG. 6A is a cross-section view of the shock absorber of FIG. 2A-FIG. 2B being coupled to the printed circuit board of FIG. 4A-FIG. 4B and multiple different enclosures according to an example.
Figure 6B:
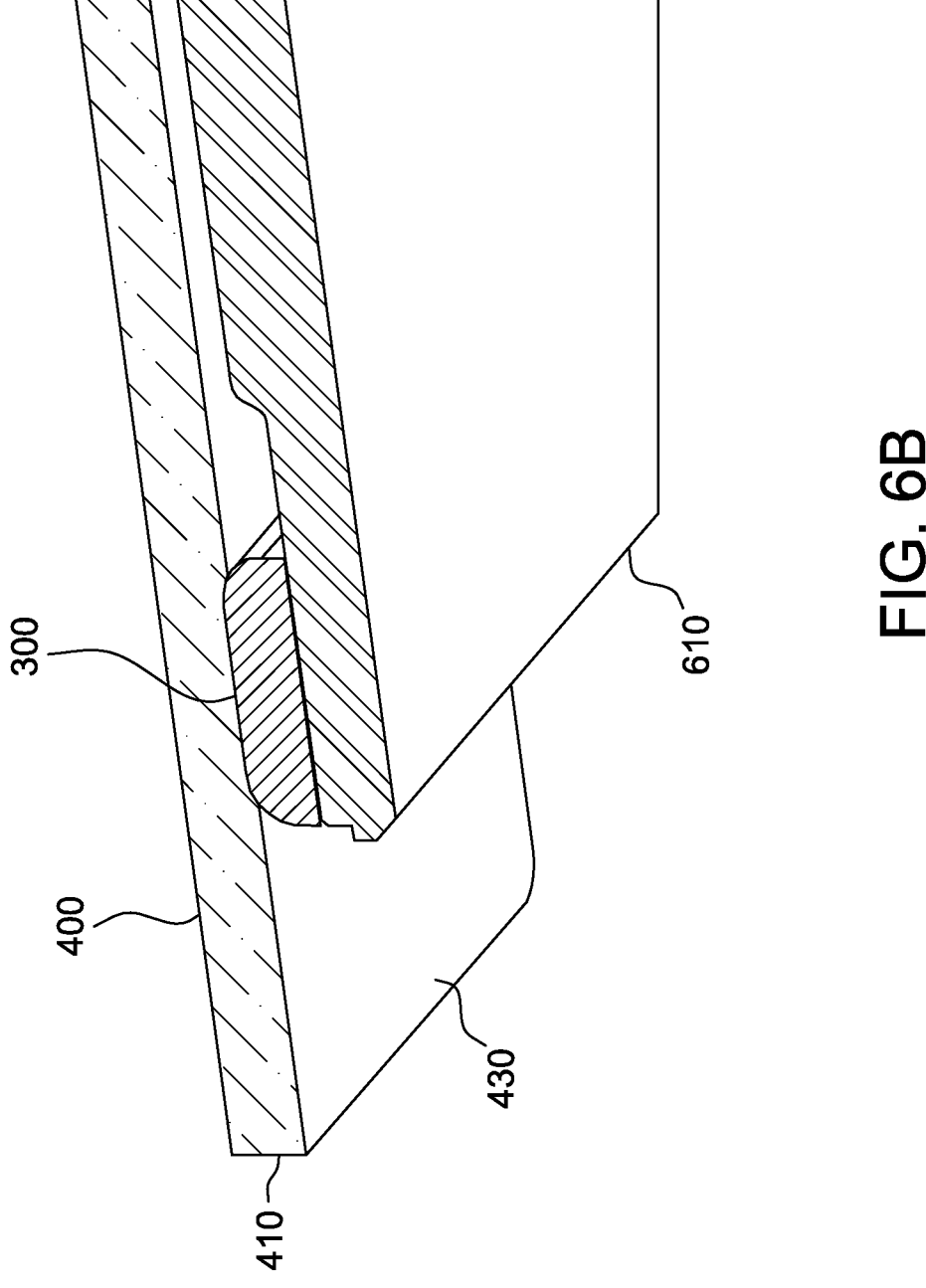
FIG. 6B is a cross-section view of the shock absorber of FIG. 3A-FIG. 3B being coupled to the printed circuit board of FIG. 4A-FIG. 4B and an associated enclosure according to an example.

FIG. 6A is a cross-section view of the shock absorber 200 of FIG. 2A-FIG. 2B being coupled to the printed circuit board 400 of FIG. 4A-FIG. 4B and multiple different enclosures according to an example and FIG. 6B is a cross-section view of the shock absorber 300 of FIG. 3A-FIG. 3B being coupled to the printed circuit board 400 of FIG. 4A-FIG. 4B and an associated enclosure 610 according to an example.

As shown in FIG. 6A, the shock absorber 200 is coupled to the printed circuit board 400 such as previously described. For example, the stiffener 245 of the shock absorber 200 is coupled to a first surface 420 of the printed circuit board 400 at or near the connector 410.

An enclosure 440 is also received by the shock absorber 200. For example, a proximal end of the enclosure 440 may contact the inner surface 250 (FIG. 2A) of the sidewall 210. Additionally, a protrusion 250 (FIG. 2B) of the first flange 225 (FIG. 2A) and the second flange 227 may be received into an aperture 460 (FIG. 5) defined by the enclosure 440. The shelf 240 of the shock absorber 200 may also receive or otherwise support the proximal end of the enclosure 440.

An additional enclosure 600 may also surround or partially enclose the printed circuit board 400 and/or the enclosure 440. In an example, the enclosure 600 defines an opening 620 through which the connector 410 extends. In order to provide additional support, the top surface 207 (FIG. 2A) of the base portion 205 may contact or otherwise support at least a portion of the opening 620 such as shown in FIG. 6A.

Likewise, the outer surface 215 (FIG. 2A) of the sidewall 210 may also contact or otherwise support an inner surface of the enclosure 600. In an example, a shape and/or contours of the inner surface of the enclosure 600 may match or substantially correspond to a shape and/or contours of the outer surface 215 of the sidewall 210.

As shown in FIG. 6B, the shock absorber 300 may be positioned or otherwise be located between a top surface of an enclosure 610 and the bottom surface of the printed circuit board 400. In an example, the enclosure 610 may be part of the enclosure 600. In another example, the top surface of the enclosure 610 may include one or more protrusions that are received by the apertures 340 (FIG. 3B) defined by the bottom surface 330 (FIG. 3B) of the shock absorber 300.

Based on the above, examples of the present disclosure describe a shock absorber for a printed circuit board, comprising: a base having a top surface and a bottom surface opposite the top surface; a sidewall perpendicular to, and extending from, at least a portion of the top surface of the base, the sidewall defining an outer surface and an inner surface opposite the outer surface; a flange perpendicular to, and extending from, a first portion of the inner surface of the sidewall, the flange defining a top surface and a bottom surface; a protrusion extending from the bottom surface of the flange; and a shelf perpendicular to, and extending from, a second portion of the inner surface of the sidewall, wherein the shelf is adapted to support at least a portion of an enclosure associated with the printed circuit board. In an example, the shock absorber also includes a support structure extending from a bottom surface of the shelf. In an example, the enclosure comprises a connector of the printed circuit board. In an example, the protrusion is adapted to mate with an aperture defined by the enclosure associated with the printed circuit board. In an example, at least a portion of the shock absorber is flexible and is adapted to move from a first position to a second position when the protrusion mates with the aperture defined by the enclosure. In an example, the shock absorber also includes a stiffener coupled to the bottom surface of the base. In an example, the stiffener is comprised of a first material and the base is comprised of a second material different than the first material. In an example, the stiffener is adapted to be coupled to a first side of the printed circuit board.

Examples also describe a shock absorber assembly for a printed circuit board, comprising: a first shock absorber adapted to be coupled to a first side of the printed circuit board, the first shock absorber comprising: a base having a top surface and a bottom surface opposite the top surface; a sidewall perpendicular to, and extending from, at least a portion of the top surface of the base, the sidewall defining an outer surface and an inner surface opposite the outer surface; a flange perpendicular to, and extending from, a first portion of the inner surface of the sidewall; and a shelf perpendicular to, and extending from, a second portion of the inner surface of the sidewall, the shelf for supporting at least a portion of an enclosure associated with the printed circuit board; and a second shock absorber separate from the first shock absorber and adapted to contact a second side of the printed circuit board opposite the first shock absorber, the second shock absorber comprising: a substantially planar top surface; a substantially planar bottom surface opposite the substantially planar top surface; and a sidewall extending between the substantially planar top surface and the substantially planar bottom surface. In an example, the flange comprises a protrusion extending from the bottom surface. In an example, the protrusion is adapted to mate with an opening defined by the enclosure associated with the printed circuit board. In an example, the flange extends a first distance from the inner surface of the sidewall; and the shelf extends a second distance from the inner surface of the sidewall, wherein the first distance is substantially equivalent to the second distance. In an example, the shock absorber assembly also includes a support structure extending from a bottom surface of the shelf. In an example, the support structure extends from the bottom surface of the shelf to a stiffener coupled to the base. In an example, the substantially planar bottom surface of the second shock absorber defines at least one alignment hole, the at least one alignment hole adapted to receive at least a portion of an assembly associated with the printed circuit board. In an example, the flange is a first flange and the shock absorber assembly further comprises a second flange perpendicular to, and extending from, a third portion of the inner surface of the sidewall, the second flange and the first flange defining an aperture that separates the first flange and the second flange. In an example, a width of the shelf is substantially equivalent to a width of the aperture. In an example, the shock absorber assembly also includes a stiffener coupled to the bottom surface of the base.

Examples also describe a shock absorber for a printed circuit board, comprising: a base; a sidewall perpendicular to, and extending from, the base, the sidewall defining a first surface and a second surface; an attachment means perpendicular to, and extending from, a top edge of the inner surface of the sidewall; a locking means extending from a bottom surface of the attachment means, the locking means adapted to receive at least a portion of an enclosure means associated with the printed circuit board; and a support means, perpendicular to, and extending from the inner surface of the sidewall, the support means extending from the inner surface of the sidewall beneath the top edge of the inner surface of the sidewall and adapted to support at least a portion of the enclosure means associated with the printed circuit board. In an example, the shock absorber also includes a stiffening means coupled to the base.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce various embodiments with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of:

A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A shock absorber for a printed circuit board, comprising:
   a base;
   a sidewall perpendicularly extending from an edge of the base, the sidewall defining an outer surface and an inner surface opposite the outer surface;
   a flange perpendicularly extending from a top edge of the inner surface of the sidewall, the flange defining a horizontal top surface and a horizontal bottom surface;
   a protrusion extending from the bottom surface of the flange; and
   a shelf perpendicularly extending from the inner surface of the sidewall such that a top surface of the shelf and the bottom surface of the flange define a space, wherein the shelf is adapted to support at least a portion of an enclosure associated with the printed circuit board when the at least the portion of the enclosure is received within the space.

2. The shock absorber of claim 1, further comprising a support structure extending from a bottom surface of the shelf.

3. The shock absorber of claim 1, wherein the protrusion is adapted to mate with an aperture defined by the enclosure associated with the printed circuit board.

4. The shock absorber of claim 3, wherein at least a portion of the shock absorber is flexible and is adapted to move from a first position to a second position when the protrusion mates with the aperture defined by the enclosure.

5. The shock absorber of claim 1, further comprising a stiffener coupled to a bottom surface of the base.

6. The shock absorber of claim 5, wherein the stiffener is comprised of a first material and the base is comprised of a second material different from the first material.

7. The shock absorber of claim 5, wherein the stiffener is adapted to be coupled to a first side of the printed circuit board.

8. A shock absorber assembly for a printed circuit board, comprising:
   a first shock absorber, comprising:
      a base;
      a sidewall perpendicularly extending from an edge of the base, the sidewall defining a vertical outer surface and a vertical inner surface opposite the vertical outer surface;
      a flange perpendicularly extending from a top edge of the inner surface of the sidewall and defining a horizontal top surface and a horizontal bottom surface;
      a protrusion extending from the horizontal bottom surface of the flange; and
      a shelf perpendicularly extending from the inner surface of the sidewall and positioned closer to the base than the flange; and
   a second shock absorber separate from the first shock absorber and comprising:
      a substantially planar top surface;

a substantially planar bottom surface opposite the substantially planar top surface; and a sidewall extending between the substantially planar top surface and the substantially planar bottom surface.

9. The shock absorber assembly of claim 8, wherein the protrusion has a first dimension at a proximal end and a second dimension at a distal end, wherein the first dimension is larger than the second dimension.

10. The shock absorber assembly of claim 8, wherein:

the flange extends a first distance from the inner surface of the sidewall; and the shelf extends a second distance from the inner surface of the sidewall, wherein the first distance is substantially equivalent to the second distance.

11. The shock absorber assembly of claim 8, further comprising a support structure extending from a bottom surface of the shelf.

12. The shock absorber assembly of claim 11, wherein the support structure extends from the bottom surface of the shelf to a stiffener coupled to the base.

13. The shock absorber assembly of claim 8, wherein the substantially planar bottom surface of the second shock absorber defines at least one alignment hole.

14. The shock absorber assembly of claim 8, wherein the flange is a first flange and wherein the shock absorber assembly further comprises a second flange positioned proximate to the first flange, the second flange and the first flange defining an aperture.

15. The shock absorber assembly of claim 14, wherein a width of the shelf is substantially equivalent to a width of the aperture.

16. The shock absorber assembly of claim 8, further comprising a stiffener coupled to a bottom surface of the base.

17. The shock absorber assembly of claim 8, wherein at least a portion of the first shock absorber is flexible.

18. A shock absorber for a printed circuit board, comprising:

a base;

a stiffening means coupled to the base;

a sidewall perpendicular to, and extending from, the base, the sidewall defining a first surface and a second surface;

an attachment means perpendicular to, and extending from, a top edge of the first surface of the sidewall;

a locking means extending from a bottom surface of the attachment means; and a support means, perpendicular to, and extending from the first surface of the sidewall, the support means extending from the first surface of the sidewall beneath the top edge of the first surface of the sidewall.

19. The shock absorber of claim 18, wherein a first portion of the locking means has a first dimension and a second portion of the locking means has a second dimension that is smaller than the first dimension.

20. The shock absorber of claim 18, wherein the stiffening means is made of a material different from a material of the shock absorber.

* * * * *